(12) United States Patent
Binner (10) Patent No.: US 9,474,178 B2
(45) Date of Patent: Oct. 18, 2016

(54) ELECTRONICS DEVICE HOUSING

(71) Applicant: WAGO Verwaltungsgesellschaft mbH, Minden (DE)

(72) Inventor: Lars Binner, Melle (DE)

(73) Assignee: WAGO VERWALTUNGSGESELLSCHAFT MBH, Minden (DE)

( * ) Notice: Subject to any disclaimer, the term of this patent is extended or adjusted under 35 U.S.C. 154(b) by 0 days.

(21) Appl. No.: 14/408,028

(22) PCT Filed: Jun. 25, 2013

(86) PCT No.: PCT/EP2013/063266
§ 371 (c)(1),
(2) Date: Dec. 15, 2014

(87) PCT Pub. No.: WO2014/001329
PCT Pub. Date: Jan. 3, 2014

(65) Prior Publication Data
US 2015/0173223 A1    Jun. 18, 2015

(30) Foreign Application Priority Data

Jun. 25, 2012 (DE) .................... 20 2012 102 325 U (51) Int. Cl.
*H05K 5/02* (2006.01)
*H01R 9/24* (2006.01)
(Continued)

(52) U.S. Cl.
CPC .......... *H05K 5/0247* (2013.01); *H01R 9/2408* (2013.01); *H01R 13/447* (2013.01); *H05K 7/1428* (2013.01); *H05K 7/1469* (2013.01)

(58) Field of Classification Search
USPC ........................................................ 174/50
See application file for complete search history.

(56) References Cited

U.S. PATENT DOCUMENTS

| 5,253,143 A * | 10/1993 | Klinger ................ H05K 5/0247 361/736 |
| 7,989,696 B2 * | 8/2011 | Shi ........................ H05K 5/0221 174/135 |
| 8,471,145 B2 * | 6/2013 | Suzuki .................... H02S 40/34 174/50 |

FOREIGN PATENT DOCUMENTS

DE    20 2009 002498 U1    7/2010
DE    10 2009 035 716 A1    2/2011
(Continued)

OTHER PUBLICATIONS

International Preliminary Report on Patentability dated Jan. 8, 2015 corresponding to application No. PCT/EP2013/063266 filed on Jun. 25, 2013.
(Continued)

*Primary Examiner* — Dhirubhai R Patel
(74) *Attorney, Agent, or Firm* — Renner, Otto, Boisselle & Sklar, LLP.

(57) ABSTRACT

The invention describes an electronics device housing having two side wall elements, which are spaced apart from one another, for forming a housing having a housing interior for accommodating at least one printed circuit board, wherein at least one fitting location for conductor connection plug connectors is provided on at least one of the end faces in the intermediate space between the side wall elements. The electronics device housing has receiving devices in the region of the at least one fitting location, the receiving devices being designed to selectively receive—an ejector element, which can be pivotably mounted on the electronics device housing by the receiving devices, for ejecting a conductor connection plug connector from a fitting location, or—a locking element, which can be fixedly latched to the electronics device housing by of the receiving devices, for locking a conductor connection plug connector at a fitting location.

12 Claims, 11 Drawing Sheets

(51) Int. Cl.
*H01R 13/447* (2006.01)
*H05K 7/14* (2006.01)

(56) References Cited

FOREIGN PATENT DOCUMENTS

| DE | 10 2009 059 011 A1 | 6/2011 |
| EP | 1 513 385 A1 | 3/2005 |
| EP | 2 110 894 A2 | 10/2009 |
| EP | 2 120 296 A1 | 11/2009 |
| EP | 2 280 453 A1 | 2/2011 |
| WO | 2011/073342 A1 | 6/2011 |

OTHER PUBLICATIONS

International Search Report and Written Opinion dated Nov. 26, 2013 corresponding to application No. PCT/EP2013/063266 filed on Jun. 25, 2013.

* cited by examiner

ELECTRONICS DEVICE HOUSING

This application is a national phase of International Application No. PCT/EP2013/063266 filed Jun. 25, 2013.

TECHNICAL FIELD

The invention relates to an electronics device housing having two side wall elements, which are spaced apart from one another, for forming a housing having a housing interior for receiving at least one printed circuit board, wherein at least one fitting location for conductor connection plug connectors is provided on at least one of the end sides in the intermediate space between the side wall elements.

BACKGROUND

Electronics device housings of this type are known in various embodiments from various manufacturers. They are used in particular to provide an initially universal system, which can be adapted to the individual need by users by suitable selection of the available system components and fitting with plug connectors and mating plug connectors. An individually adapted electronics device housing can thus be created in a simple and cost-effective manner from a universal system consisting of various system components including the side wall elements of an electronics device housing.

EP 2 120 296 A1 discloses an electronics housing, which can be arranged in a row, for receiving at least one printed circuit board, preferably oriented perpendicular to a row direction, comprising an electronics unit, which is provided on one side with a pin contact or female connector strip. This pin contact or female connector strip is contacted by a connection strip which is designed on one side for contact with external conductors or a multipoint connector.

DE 10 2009 059 011 A1 discloses a connection system for connecting a single-row housing to a connection element. A connection region for connection of the connection element to the single-row housing is provided on the single-row housing. The connection element can be secured to the connection region by means of a plug contact. The plug contact can be formed in a pin-shaped manner for example.

In addition, a conductor connection plug connector having an insulating material housing and a friction spring received in the insulating material housing is known from DE 10 2009 035 716 A1. The insulating material housing is intended to receive a pin contact from one side and to receive an electrical conductor from the opposite side, wherein the electrical conductor is pressed against the pin contact by the force of the friction spring and contacts said pin contact directly or by means of an interposed sheet metal element.

Proceeding on this basis, the object of the present invention is to create an improved electronics device housing, which, with a simple structure, allows a flexible adaptation with regard to the fitting locations for printed circuit board plug connectors.

The object is achieved by the electronics device housing having the features of claim 1. Advantageous embodiments are described in the dependent claims.

BREIF SUMMARY OF THE INVENTION

It is proposed for the electronics device housing to have receiving devices in the region of the at least one fitting location, said receiving devices being designed to selectively receive an ejector element, which can be pivotably mounted in an electronics device housing by means of the receiving device, for ejecting a conductor connection plug connector from a fitting location, or a locking element, which can be fixedly latched to an electronics device housing by means of the receiving devices, for locking a conductor connection plug connector at a fitting location.

In accordance with the teaching of the present invention, receiving devices are thus provided at the fitting locations and an ejector element or a locking element can be selectively attached to said receiving devices. With selection of an ejector element, the conductor connection plug connector is arranged detachably by pivoting the ejector element, whereas with selection of a locking element received in a fixedly latched manner by means of the latched receipt, the conductor connection plug connector is locked at the fitting location. The contacting of the conductor connection plug connector is constant independently thereof.

The receiving devices at the fitting locations are such that either a pivotable mounting of an ejector element or a fixedly latched receipt of a locking element is made possible selectively.

It is thus possible in a simple manner to receive selectively a conductor connection plug connector in an ejectable manner or in fixedly locked manner on the electronics device housing, wherein only one set of accessory parts comprising ejector elements and locking elements has to be provided for an electronics device housing.

It is particularly advantageous if the receiving devices are furthermore intended for the selectable receipt of a blind cap element, which can be fixedly latched on the side wall elements by means of the receiving devices, for covering a free fitting location not intended for receiving a conductor connection plug connector. The set may therefore also comprise a third accessory part in the form of a blind cap element, which, similarly to the locking element, can be fixedly latched on the electronics device housing. The blind cap element may thus have the same latching devices as the locking element and may thus be latched on the electronics housing in the same way as the locking element. In contrast to the locking element, which engages around the conductor connection plug connector only in part for locking, the unused fitting location is covered by the blind cap element.

The mounting of the accessory parts at the fitting locations of the electronics device housing is successful in a very simple and reliable manner if intermediate wall portions in the region of the fitting locations extend transversely to the side wall elements on a respective end side. These intermediate wall portions then have a free upper edge with a bearing groove for selectively receiving a bearing shaft of an ejector element, locking element or blind cap element. Due to the intermediate wall portions extending transversely to the side wall elements, a stable bearing for receiving an accessory part in a pivotable or fixedly latched manner is thus created, without excessively loading the generally thinner and therefore more flexible side walls.

The intermediate wall portions may preferably be an integral part of an intermediate frame which forms the interior of the electronics device housing and by means of which the side walls are laterally closed.

Here, it is particularly advantageous if openings for receiving free ends of a bearing shaft are provided on the side wall elements, in line with the bearing groove. The bearing shaft thus also extends through the side wall elements, which increases the stability of the mounting. In particular, the accessory part in the form of an ejector element, locking element or blind cap element then cannot be removed easily from the bearing groove. Rather, in order to remove the accessory part, the bearing shaft would have to be removed from the bearing groove and the openings in the side wall elements.

Alternatively to a bearing groove on the intermediate wall portions, a mutually opposed pair of openings for receiving free ends of an associated bearing shaft of an ejector element, locking element or blind cap element may be provided in the lower region of the fitting locations on the side wall elements. With this variant, the accessory part is mounted on the side wall elements by bearing shafts fitted into the openings in the side wall elements. These bearing shafts may be, for example, laterally protruding cylindrical bearing journals. A reliable mounting without deformation of the side walls outwardly is also achieved successfully with the aid of the bearing openings in the side wall elements. However, the bearing surface here is reduced to the openings, which are rather short in practice, such that the force, in contrast to the previously described variant, is concentrated over a relatively small region of the side wall elements, which are relatively thin in practice.

In a preferred embodiment, latching journals in the upper region of the fitting locations may protrude from the side wall elements into the gap between the two side wall elements. The latching journals are provided here selectively for latching an ejector element mounted pivotably on the electronics device housing in that at least one latching journal protruding from the side wall element plunges into a latching opening on the ejector element. However, the protruding latching journals may also be used to fix a locking element or blind cap element in that a peripherally closed bore is provided in the locking element or blind cap element, into which bore an associated latching journal plunges. The latching journals protruding laterally from the side wall elements and arranged opposite one another can thus be used equally for latching a pivotable ejector element and for fixing a locking element or blind cap element. For the detachable latching, a latching opening corresponding to the latching journal then only has to be provided on the ejector element, whereas the fixed receipt of the locking element or blind cap element is achieved by a bore or opening that runs peripherally so far that the latching journal cannot be guided out laterally from the bore or opening via the latching opening.

In combination with the latching journal or preferably alternatively to the latching journal on the side wall elements, openings can be provided in the upper region of the fitting locations in the side wall elements in order to receive latching lugs protruding laterally from an ejector element or to receive locking pins which protrude laterally from a locking element or blind cap element or which can be fixedly inserted thereinto from outside via the openings in the side wall elements. In this embodiment, latching lugs or locking pins thus protrude from the accessory parts (ejector element, locking element or blind cap element) and cooperate with openings in the side wall elements.

The detachable latching of a pivotable ejector element is implemented successfully by guiding a latching lug into an associated opening by temporary deformation of the side wall element. To this end, the latching lug may have, for example, an inclined insertion surface, which allows the locking and unlocking in order to pivot the ejector element with a defined force.

The fixed latching, that is to say fixing, of the locking elements or blind elements is by contrast implemented successfully by locking pins that are guided into the openings and cannot be removed automatically from the openings, even if it is attempted to pivot the locking element or blind cap element. The design of the latching lugs thus leads to the detachable locking, whereas the design of the locking pins leads to the fixed locking of the accessory parts.

This variant is relatively simple and cost-effective, but has the advantage that the side walls are temporarily deformed when the ejector element is pivoted.

A base plate with a mounting rail latching foot for latching the electronics device housing onto a mounting rail is preferably provided in the lower region of the electronics device housing. This base plate may be an integral part of an intermediate frame, for example, which is covered laterally by the side wall elements and forms the interior of the electronics device housing.

Due to such a mounting rail latching foot, an electronics device housing is created that can be latched onto a mounting rail without great assembly effort and can be arranged in a row side by side with further electronics device housings and/or series terminals or other electrical devices.

In a preferred embodiment, at least one curved locking pin receiving opening for receiving an associated locking pin is provided in the upper region of the electronics device housing and protrudes from a cover element. With the aid of such a receiving opening for a curved locking pin, it is possible to successfully mount a cover element on the electronics device housing in a manner secured against manipulation. The locking pins in the receiving opening, when the cover element is levered out upwardly away from the electronics device housing, form a stop, which prevents an unauthorized removal of the cover element. In addition, such a receiving opening for a locking pin can also be used as mount for a cover element and as a display element, which can be fitted onto the electronics device housing.

It is particularly advantageous if contact carriers with contact pins can be introduced selectively in the lower region of fitting locations. Here, the contact pins are oriented with a free end for contacting a printed circuit board, which can be introduced into the interior of the electronics device housing, and with the other free end as a mating contact for a printed circuit board plug connector, which can be plugged into the fitting location. Such a contact carrier with contact pins can be introduced as necessary at the fitting locations at which printed circuit board plug connectors are to be plugged in. The other fitting locations not provided with a contact carrier can then be covered by a blind cap element. Such a contact carrier with contact pins has the advantage that the contact pins are fixedly mounted in the contact carrier and together with the contact carrier form a unit. Such a contact carrier supports the modular construction of the electronics device housing, which then can be fitted as required with the aid of the accessory parts at the fitting locations with contact carriers and detachable or fixedly locked printed circuit board plug connectors or with blind cap elements.

The contact carrier can also be used as a bearing for the accessory part (ejector element, locking element or blind cap element).

The ejector element is preferably formed such that the ejector element has at least one protruding finger adjacently to a bearing shaft. The at least one finger then engages, in the state installed pivotably on the receiving devices of the electronics device housing, beneath a printed circuit board plug connector plugged into an associated fitting location in order to eject said printed circuit board plug connector out from the fitting location by pivoting the ejector element. The ejector element is thus L-shaped in cross section, wherein the bearing shaft is arranged in the transition from the finger to the outgoing actuation arm.

The locking element is preferably formed such that at least one protruding collar is provided on a free upper edge. The collar is then adapted such that, in the position latched onto a fitting location on the electronics device housing, the collar engages over a printed circuit board plug connector plugged into this fitting location and secures said connector against removal from the fitting location.

The printed circuit board plug connector is thus successfully locked in the plugged position in that the locking element engages over the printed circuit board plug connector with the aid of the collar and therefore secures said connector against removal.

BRIEF DESCRIPTION OF THE DRAWINGS

The invention will be explained in greater detail hereinafter on the basis of an exemplary embodiment with the accompanying drawings, in which.

DESCRIPTION OF THE INVENTION

Figure 1:
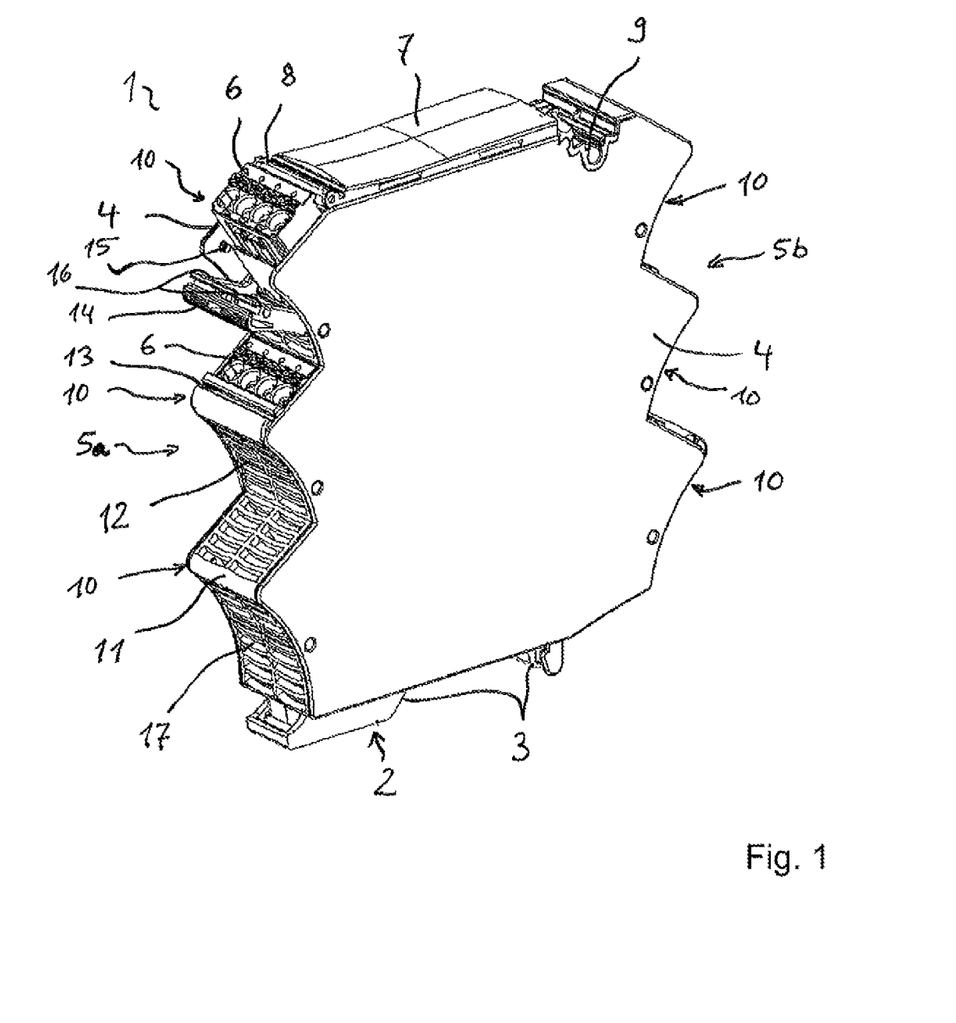
FIG. 1—shows a perspective view of an electronics device housing with a conductor connection plug connector not yet plugged in fully.

FIG. 1 shows a perspective view of an electronics device housing 1, which has an intermediate frame (not visible) for forming an interior for receiving electronics, for example on a printed circuit board. The intermediate frame, in the lower region, has a base plate 2 with a mounting rail latching foot 3, which allows the electronics device housing to be detachably latched onto a mounting rail. In this way, a number of such electronics device housings 1 can be arranged in a row side by side on the mounting rail.

The electronics device housing 1 is closed at the sides with the aid of side walls 4. The side walls, which are distanced from one another, form an intermediate space on the front end side 5a and rear end side 5b for receiving conductor connection plug connectors 6. In this way, the electronics device housing 1 can be connected to electrical lines via the conductor connection plug connector 6.

The upper side of the electronics device housing 1 is covered by a pivotable cover 7, which is mounted at a pivot bearing 8. Furthermore, a latching groove 9 for receiving identification elements or the like is provided on the upper side of the electronics device housing 1.

Fitting locations are provided on the front and rear end side 5a, 5b in three planes and can be used in order to mount conductor connection plug connectors 6. The electronics device housing 1, however, can be assembled individually by the user such that fitting locations remain free where appropriate and cannot be fitted with conductor connection plug connectors 6.

For the case that a fitting location 10 remains free and is not to be fitted with a conductor connection plug connector 6, this fitting location can be covered on the respective end side 5a, 5b with a blind cap element 11. This blind cap element 11 is fixedly latched on the electronics housing 1 and cannot be easily removed when the electronics device housing 1 is in the assembled state with fitted side walls 4.

For the case that a fitting location 10 is to be fitted with a conductor connection plug connector 6, the user has two options.

On the one hand, it is possible to install a conductor connection plug connector 6 fixedly in a fitting location 10. To this end, a locking element 12 which can be latched fixedly on the electronics device housing 1 is used. This locking element is plugged together with the electronics device housing 1 comparably to the blind cap element 11 and then cannot be detached easily, but is mounted in a fixed position on the electronics device housing 1. Here, the locking element 12 on the upper side has a protruding collar 13, which is adapted such that the locking element 12, in the position illustrated in FIG. 1 latched on the electronics device housing 1 at a fitting location 10, secures a conductor connection plug connector 6 against removal from the fitting location 10, said connector being plugged in fully at this fitting location 10 and the collar 13 engaging over said connector. Alternatively or additionally to the collar 13, latching openings may also be provided, into which protruding latching journals of a conductor connection plug connector 6 plunge in order to be locked. It is clear that the conductor connection plug connector 6 cannot be removed upwardly from the electronics device housing 1, for example when an electrical conductor plugged into the conductor connection plug connector 6 is pulled. This is prevented by the collar 13, which engages over the conductor connection plug connector 6.

In this way, the locking element 12 can be used to ensure that an associated conductor connection plug connector 6 is likewise installed fixedly in the electronics device housing 1. This is advantageous in particular for applications in which contact protection is necessary due to dangerous voltages.

In practice, however, there is often a need for electrical conductors to remain connected to a conductor connection plug connector 6, for example when replacing a faulty electronics device, and for the conductor connection plug connector 6 to be easily plugged into the new electronics device housing 1 in the event of exchange. To this end, it is advantageous if the conductor connection plug connectors 6 can be easily detachably connected to the electronics device housing 1. To this end, ejector elements 14 are provided, which can be arranged pivotably on the electronics device housing 1. This arrangement is advantageous in this regard because a conductor connection plug connector 6 of identical design can be used both with use of a locking element 12 and with use of an ejector element 14.

It can be seen from FIG. 1 that the ejector element 14 at the fitting location 10 in the top left on the front end side 5a is pivoted into the removal position, that is to say is opened. Here, the conductor connection plug connector 6 is partly removed from the electronics device housing 1.

Latching journals 15 are provided on the side walls 4, said journals protruding in each case into the intermediate space on the respective end side 5a, 5b and pointing toward the opposite side wall. These latching journals 15 are arranged on the mounting locations 10 adjacently to the conductor connection plug connector 6, plugged in where necessary, and aligned with latching openings 16 in the ejector elements 14. As the ejector element 14 is pivoted in the direction of the conductor connection plug connector 6, the latching openings 16 on the inner sides of the ejector elements 14 are guided into associated latching journals 15. The ejector element 14 thus latches in the closed plug position onto the latching journal 15 and the side walls 4 of the electronics device housing 1. Here, the conductor connection plug connector 6 is plugged fully into the fitting location 10. Due to the latched ejector element 14, the conductor connection plug connector 6 is held in this plugged position. The securing of the conductor connection plug connector 6 on the electronics device housing 1 in the plugged position can be improved when the conductor connection plug connector 6 cooperates with the latched ejector element 14, for example by a stop, which is arranged between the conductor connection plug connector 6 and ejector element 14 and prevents a removal of the conductor connection plug connector 6 upwardly.

In some circumstances, it is important for an electronics device to provide a circulation of air in the electronics device housing 1 for cooling. For this purpose, it is advantageous if at least the blind cap elements 11 have ventilation slots 17. It is conceivable for the locking element 12 and/or ejector element 14 to also have ventilation slots or for such ventilation slots to be provided in the intermediate frame at least in the region below the ejector element 14 and locking element 12.

Figure 2:
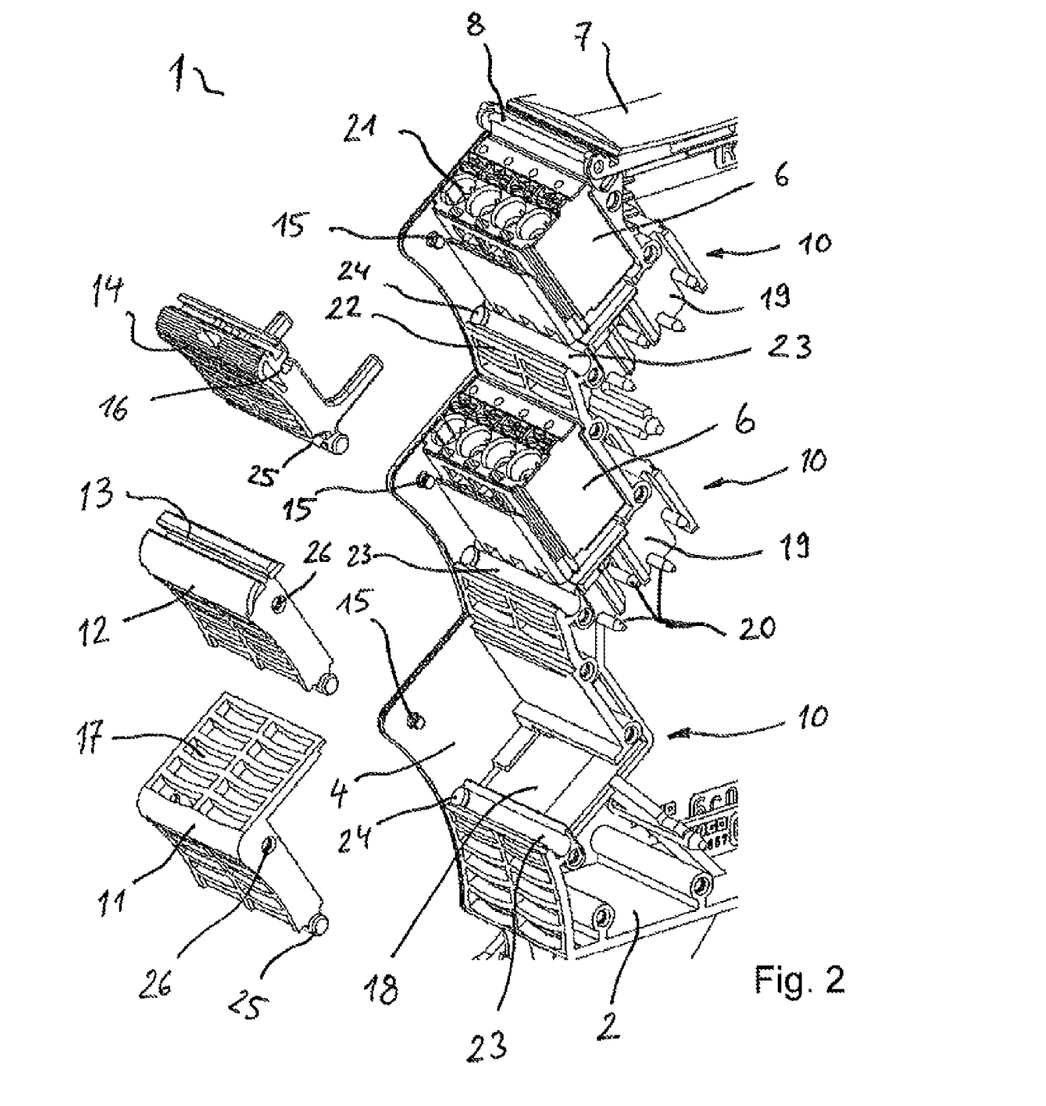
FIG. 2—shows a perspective exploded view of the electronics device housing from FIG. 1.

FIG. 2 shows a perspective exploded view of a detail of the electronics device housing 1 from FIG. 1. Here, it is clear that an intermediate frame 18 extends in the interior of the electronics device housing 1 along the end side 5a and accordingly the opposite end side 5b (not visible), on which intermediate frame fitting locations 10 are provided at three levels. The intermediate frame 18 is closed on either side by side walls 4, wherein only the left side frame is visible in FIG. 2. The intermediate frame 18 and a side wall 4 may optionally be formed in one piece.

Contact carriers 19 can be used selectively at the fitting locations 10. These contact carriers 19 have contact pins 20, which are provided on the one hand for connection to a printed circuit board in the electronics device housing 1 and on the other hand for electrical contacting of a conductor connection plug connector 6. It is clear that in this exemplary embodiment each contact carrier 19 has four contact pins 20. In each case, one of the four conductor connections of the conductor connection plug connectors 6 can thus be connected to an associated contact pin 20. The contact carriers 19 are suitable in particular for connection to a conductor connection plug connector 6 of the type described in DE 10 2007 018 443 A1 and DE 10 2009 035 716 A1, to which reference is made fully. Here, the conductor connection plug connectors 6 have friction springs (for example U-shaped friction springs), which are incorporated in the insulating material housing and which press an electrical conductor introduced into a conductor insertion opening 21 in the conductor connection plug connector 6 in the direction of a contact pin 20 plunging into the conductor connection plug connector 6 beside the electrical conductor. In this way, the electrical conductor is contacted directly or via an interposed metal sheet. The conductor connection plug connector 6 is formed such that an electrical conductor can be plugged already previously into an associated conductor connection opening 21 without the plug-in opening for the associated contact pin 20 being closed by the electrical conductor.

The contact carriers 19 can be selectively plugged into a fitting location 10 by the user when fitting the electronics device housing.

The lower fitting location 10 illustrated in FIG. 2 is not fitted with a contact carrier 19, but is to remain free. In order to cover this unfitted fitting location, a blind cap element 11 is provided, which is L-shaped in cross section. In this way, the end side of the fitting location 10 is covered both from the front and from above.

The electronics device housing 1 has, at the fitting locations 10, intermediate wall portions 22 extending transversely to the side wall elements 4 on a respective end side 5a, 5b and having a bearing groove 23 on the free upper edge. The side walls 4 may have openings 24 in line with this bearing groove 23 for receiving free ends on the bearing shaft 25.

In this way, the accessory parts comprising ejector elements 14, locking elements 12 and blind cap elements 11 can be mounted in principle pivotably on the electronics device housing 1. To this end, the accessory parts (ejector element 14, locking element 12 and blind cap element 11) on the lower edge thereof each have a bearing shaft 25, which can be inserted into an associated bearing groove 23. It is clear that the bearing shafts 25 of the accessory parts are longer than the width of the accessory parts and therefore protrude therebeyond, such that the free ends plunge into the openings 24 in the side walls 4.

The bearing grooves 23 are preferably formed in the shape of a semi-circle, such that the bearing shafts 25 are clipped into the bearing grooves 23 and are held there. The bearing grooves 23 therefore engage around the bearing shafts 25 to an extent of more than 180°.

It can also be seen that latching journals 15 protrude from the side walls 4. The ejector element 14 is now mounted pivotably at a fitting location 10 not by being connected fixedly in the upper region to the side walls of the electronic housing. Rather, the latching opening 16 open on one side is formed such that the latching journal 15 can be clipped into the associated latching opening 16. By exerting a sufficient force, the latching between latching opening 26 and latching journal 15 is released and the ejector element 14 is pivoted about the bearing shaft 25 in the bearing groove 23. Here, the locking is released and the associated conductor connection plug connector 6 is removed from the fitting location 10.

The latching journals 15 may also be used equally, however, to fixedly latch accessory parts in an electronics device housing 1. To this end, bores 26 closed fully laterally are provided on the locking element 12 and the blind cap element 11. When the locking element 12 or blind cap element 11 is installed fixedly at a fitting location 10, an associated latching journal 15 plunges into the associated bore 26. The locking element 12 or blind cap element 11 is thus reliably prevented from pivoting. The locking element 12 or blind cap 11 is thus held in the position.

Figure 3:
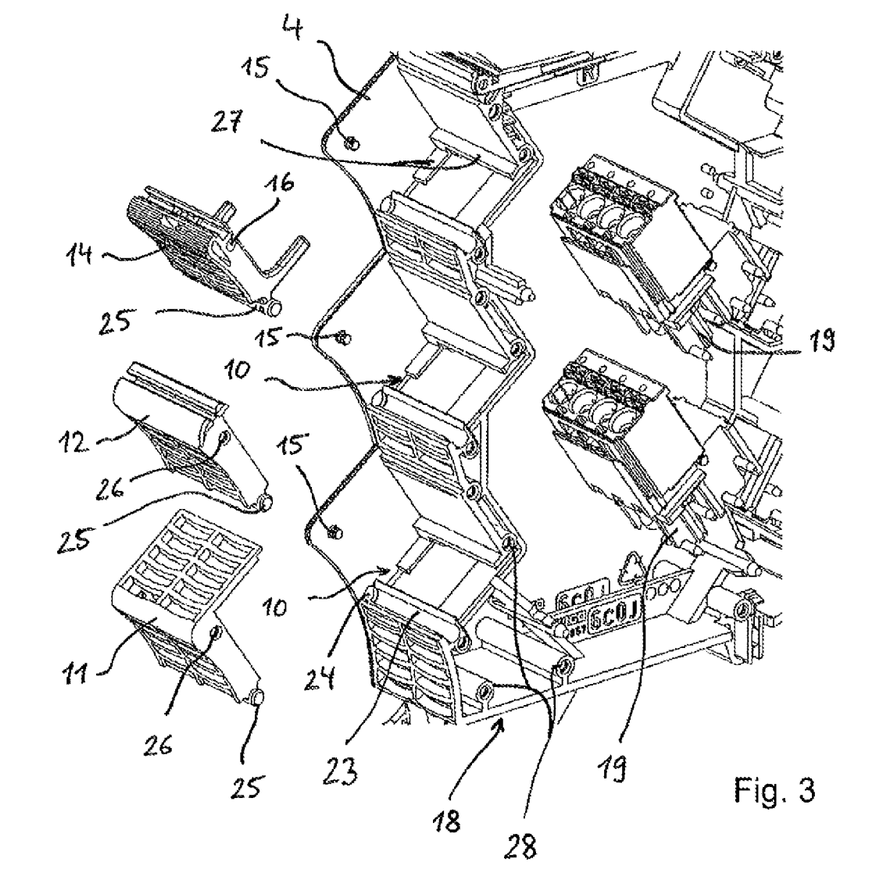
FIG. 3—shows a perspective exploded view of the electronics device housing from FIG. 2 with conductor connection plug connectors not yet positioned at fitting locations and with associated contact carriers.

FIG. 3 shows a perspective exploded view, in which the contact carriers 19 have not yet been inserted in an associated fitting location 10. It is clear that the fitting locations 10 have guides or latching protrusions 27, at which the associated contact carriers 19 of an intermediate frame 18 can be fastened. The contact carriers 19 can thus be inserted from the side into a fitting location 18, where they can be guided with the aid of the guide elements 27 into the fitting position and can be secured there.

It can also be seen that the intermediate frame has a plurality of latching openings 28 for receiving corresponding latching pins of the side walls 4 in order to plug the side walls onto the intermediate frame 18 and latch said side walls thereto.

An electronics device housing 1 can therefore be assembled in a modular manner by the user according to requirements.

Figure 4:
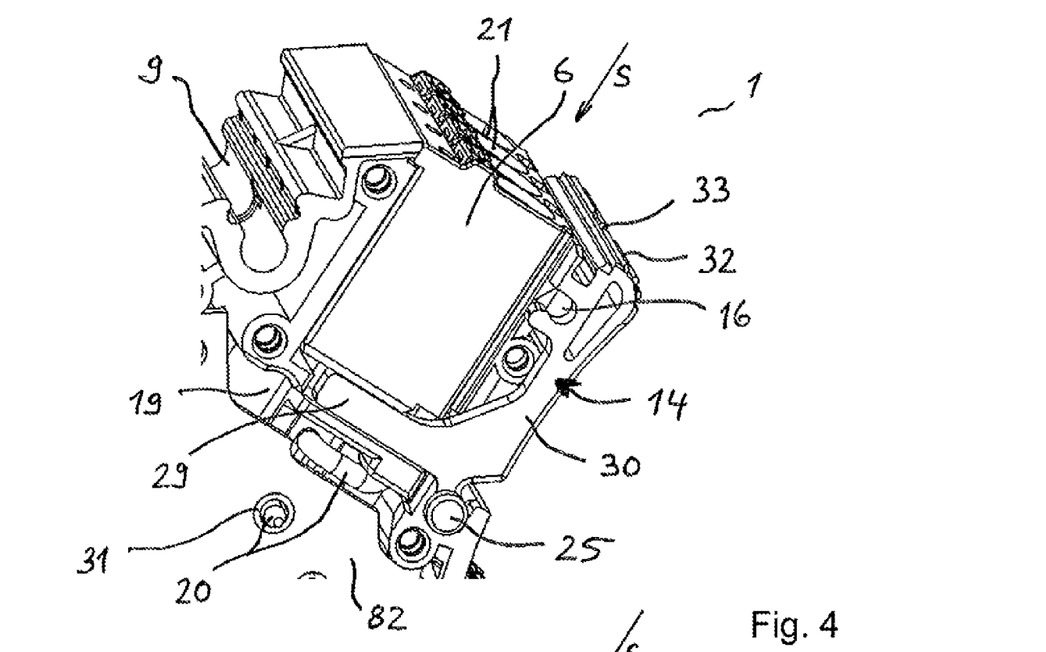
FIG. 4—shows a detail of an electronics device housing with removed side wall in the region of an ejector element with inserted conductor connection plug connector in the plugged and locking position.

FIG. 4 shows a detail of the electronics device housing 1 in the region of an ejector element 14. It is clear that the ejector element 14 is L-shaped in cross section. A pair of protruding fingers 29 is provided adjacently to the bearing shaft 25 in the illustrated exemplary embodiment, which fingers are arranged at a distance from one another on each side. An actuation arm 30 protrudes upwardly from the bearing shaft at an angle, preferably approximately perpendicularly (70°-120°) and extends approximately parallel to the plugged-in conductor connection plug connector 6.

It is clear that in the illustrated plug position, in which the conductor connection plug connector is plugged fully on the associated contact carrier 19, the fingers 29 are positioned below the conductor connection plug connector 6. The fingers 29 then extend transversely to the plug-in direction S of the conductor connection plug connector.

It can also be seen that the free ends of the contact pins 20 are guided through solder bores 31 in a printed circuit board 82 so as to be soldered to the printed circuit board 82.

It is also clear that the ejector elements 14 in the upper region have a ribbed gripping surface 32 and an actuation opening 33. The ribbed gripping surface 32 facilitates the pivoting of the ejector element 14 by hand. The actuation opening 33 can then be used to introduce a screwdriver, which serves as a lever for pivoting the ejector element 14.

Figure 5:
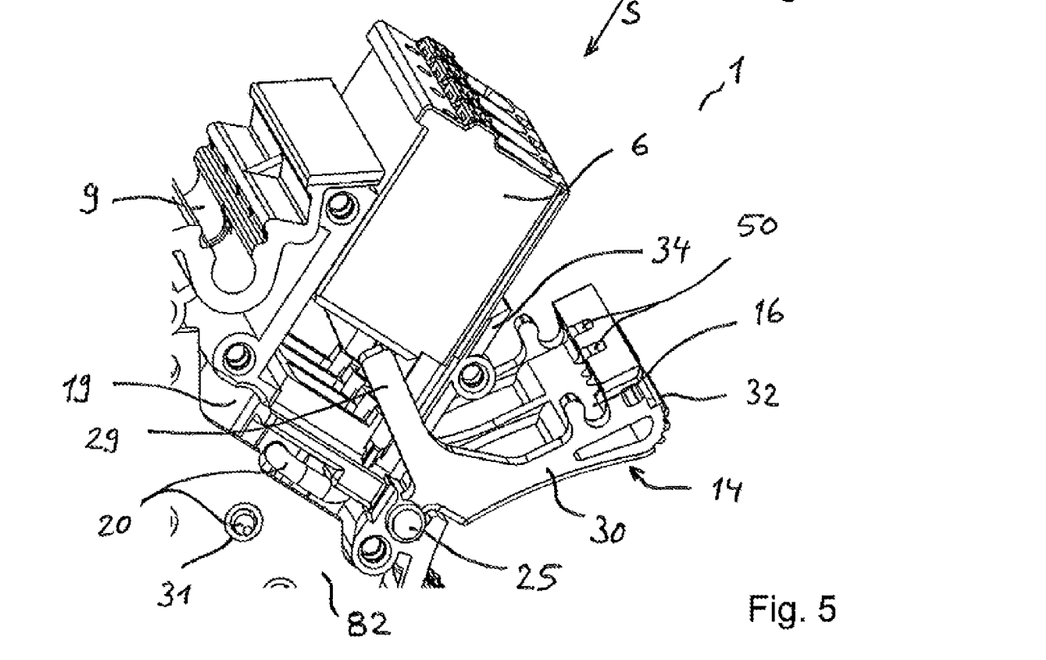
FIG. 5—shows a detail according to FIG. 4 with pivoted ejector element and conductor connection plug connector in the removal position.

FIG. 5 shows the detail from FIG. 4 in the pivoted removal position. It is clear that the conductor connection plug connector is guided away from the contact carrier 19 with the aid of the finger 29 pivoted upwardly via the free end thereof. With the aid of the pivoting of the ejector element 14 and of the finger 29, it is possible to successfully remove the conductor connection plug connector 6 upwardly from the contact pins in a defined manner. A guidance of the conductor connection plug connector 6 in the plug-in direction or opposite hereto is additionally ensured by a lateral guide wall 34 on the contact carrier 19. This guide wall 34 is located in the closed position according to FIG. 4 between the ejector elements 14 and the conductor connection plug connector 6.

Latching elements for latching the conductor connection plug connector 6 in the closed position can be provided on the ejector element 14, for example in the form of latching openings 50, in which latching journals protruding from the conductor connection plug connector 6 plunge.

Figure 6:
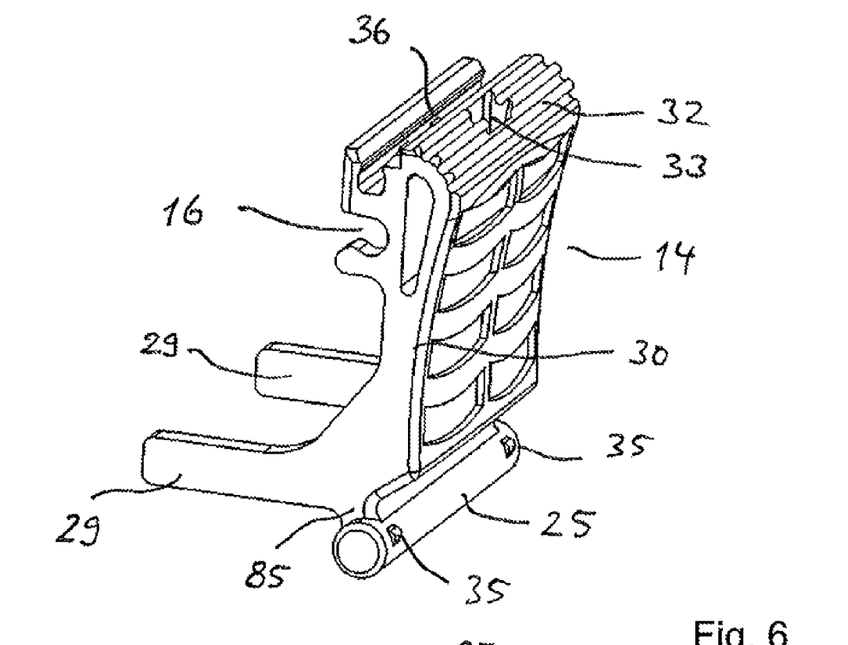
FIG. 6—shows a perspective view of the ejector element.

FIG. 6 shows a perspective view of an ejector element 14. It is clear that two fingers 29 are arranged at a distance from one another on the two sides of the ejector element 14. The fingers 29 extend via the free end thereof parallel to one another and transition opposite the free end into an actuation arm 30 projecting transversely herefrom. In the transition of finger 29 and actuation arm 30, the bearing shaft 25 is arranged therebelow on a web 85 as transition to the finger 29 and actuation arm 30. It can be seen that latching lugs 35 protruding at the two outer regions are provided on the bearing shaft 25. These latching lugs plunge in the open position shown in FIGS. 5 and 9 into corresponding cavities 38 in the bearing groove 23. The ejector element 14 is thus held in a defined open position. In the closed position according to FIG. 4 and FIG. 8, the lugs 35 latch onto a protrusion 39, arranged therebelow, of the bearing groove 23 adjacent to the cavity 38 in order to latch the ejector element 14 in the defined closed position. In order to pivot the ejector element 14, a certain force must therefore be applied in order to overcome the stop acting at the lugs 35.

It is also clear from FIG. 6 that a latching groove 36 for receiving labelling elements is formed on the upper side of the ejector element 14. These labelling elements can then be clipped into the latching groove 36 and held there.

Figure 7:
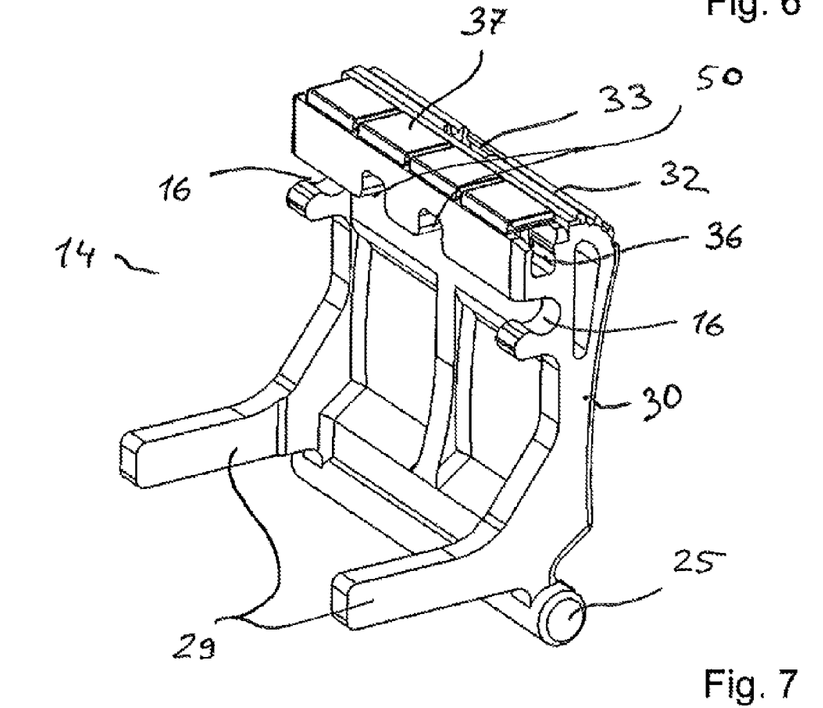
FIG. 7—shows a perspective view of the ejector element with plugged-on labelling elements.

FIG. 7 shows a perspective view of the ejector element 14 according to FIG. 6 from the other side (rear side). Here, it is clear that labelling elements 37 are now clipped into the latching groove 36. Four individual labelling elements 37 or four labelling elements 37 interconnected via a predetermined breaking point are provided, wherein one labelling element 37 is provided for each conductor insertion opening of the 4-pole conductor connection plug connector 6.

Figure 8:
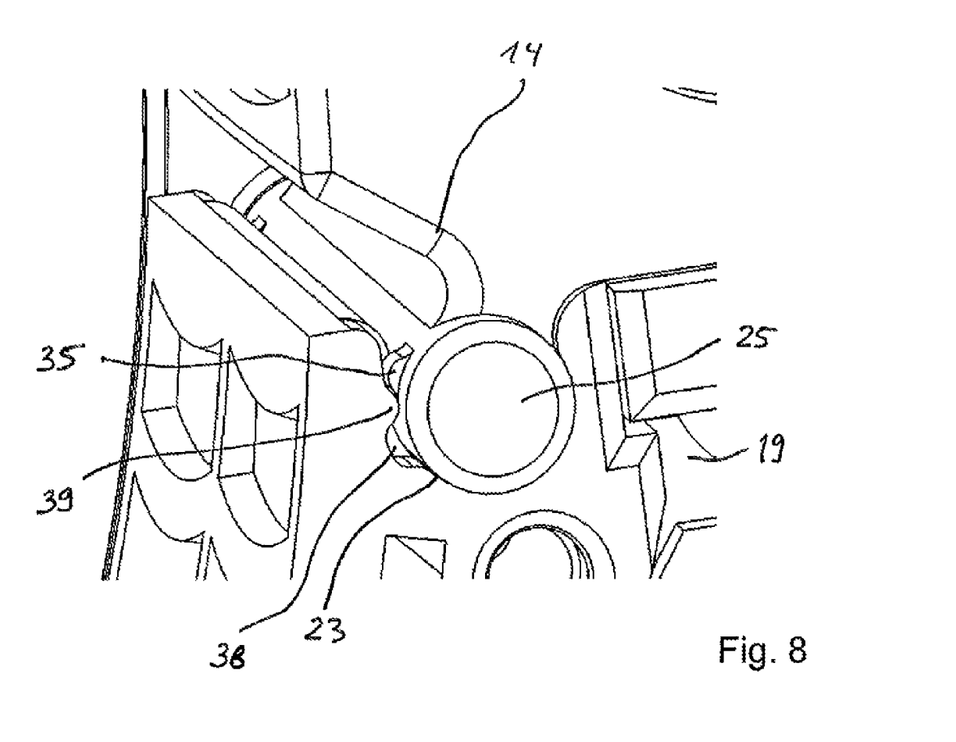
FIG. 8—shows a detail of an ejector element mounted on the electronics device housing in the region of the bearing shaft in the plugged position.

FIG. 8 shows a detail of the ejector element 14 inserted in a bearing groove 23 via the bearing shaft 25 in the closed position according to FIG. 4. It is clear that the protruding lug 35 on the bearing shaft 25, together with a protrusion 39 delimiting the cavity 38 in the bearing groove 23, forms a stop that holds the ejector element 14 in the closed position. In order to pivot the ejector element 14 in the illustration in an anti-clockwise direction, this stop must be overcome. To this end, a certain force or a sufficient torque is necessary.

Figure 9:
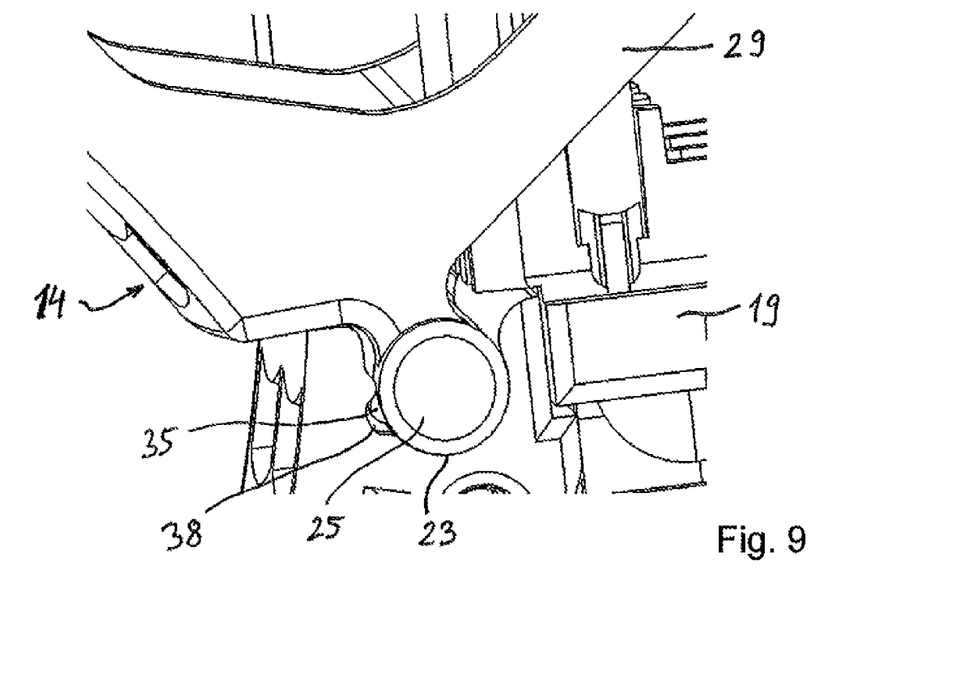
FIG. 9—shows a detail from FIG. 5 with ejector element in the removal position.

When the ejector element is then pivoted into the open position according to FIGS. 5 and 9, the protruding lug 35 of the bearing shaft 25 plunges into the cavity 38 of the bearing groove 23. The ejector element 14 thus rests in this defined open position.

Figure 10:
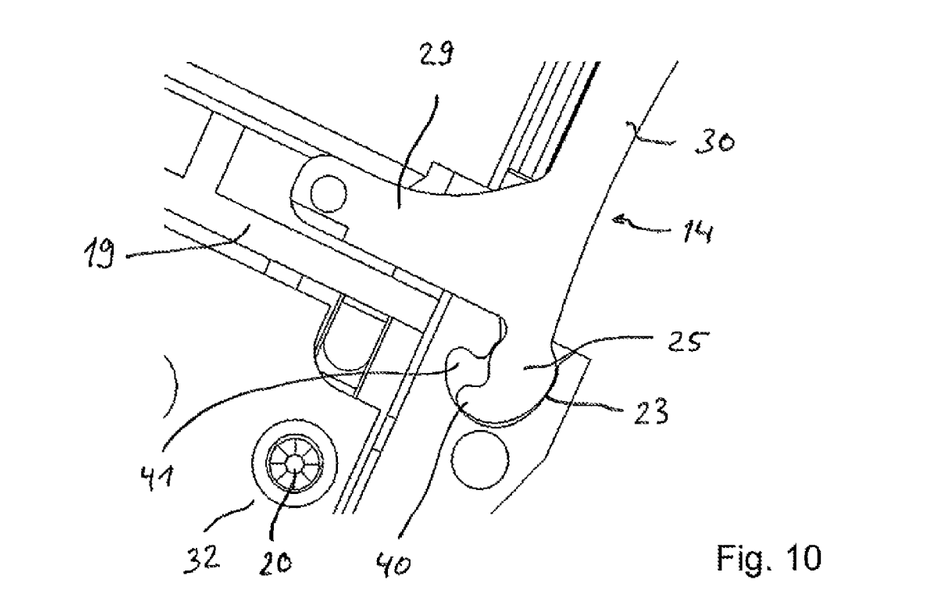
FIG. 10—shows a detail of a further embodiment of an ejector element in the plugged position with protrusion on the bearing shaft.

FIG. 10 shows a detail of a further embodiment of an ejector element 14. This ejector element 14 is in turn L-shaped with at least one finger 29 and a transversely upwardly projecting actuation arm 30 and bearing shaft 25 arranged at the bottom. The bearing shaft 25 is again curved and is snapped or clipped into the latching groove 23. It is semi-circular in cross section and is comparable to the round bar of the previously described bearing shaft 25, with the difference that a lug 40 projects from the bearing shaft 25. The bearing groove 23 has an indentation 41 or cavity matched to the lug 40, which lug 40 is able to plunge into said indentation or cavity when the ejector unit 14 is pivoted back. This is sketched in FIG. 11, which shows the ejector unit 14 in the open position corresponding to FIG. 5.

Figure 11:
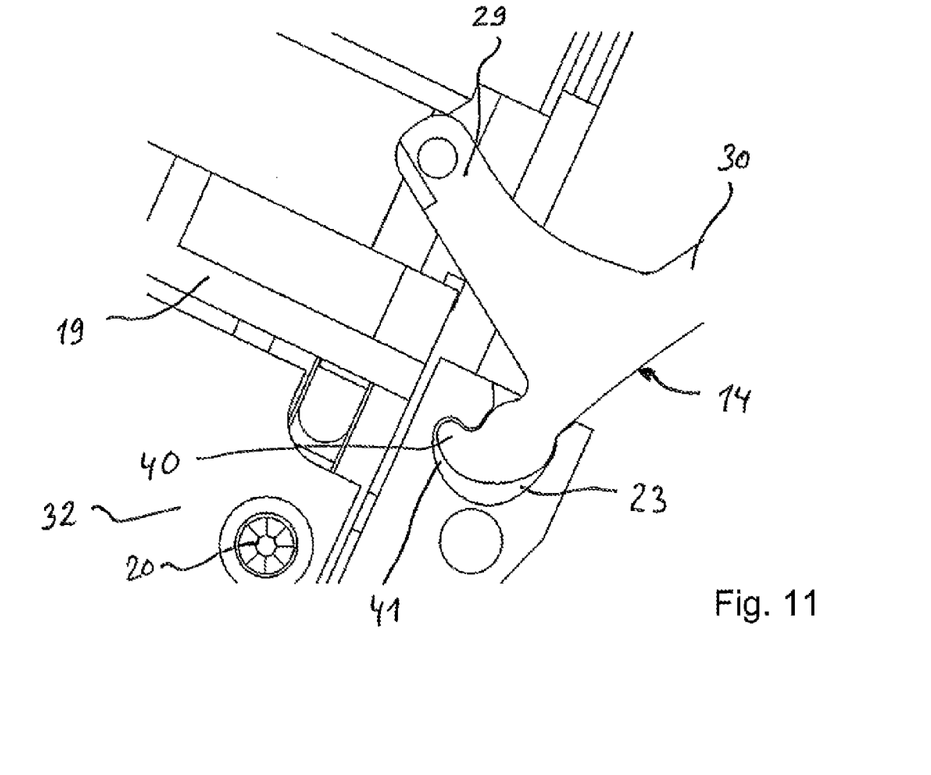
FIG. 11—shows a detail according to FIG. 10 in the unlocking position.

In this way, the lug 40 and the delimiting wall of the indentation 41 forms a stop, by means of which the ejector unit 14 is prevented or at least hindered from being levered out, which is undesirable. A further pivoting of the ejector unit 14 beyond the open position illustrated in FIG. 11 is not possible due to the lug 41.

The lug 40 and the corresponding indentation 41 may extend over the entire width of the bearing shaft 25 and/or bearing groove 23. However, it is also conceivable that, as with the lugs 35 of the previous exemplary embodiment (see FIG. 6), only a limited number of 1, 2, 3, 4 or more lugs 40 is provided, said lug/lugs being arranged at a distance from one another. In this context, it is conceivable that the indentation 41 or cavity extends over the entire length of the bearing groove 23 or that individual indentations 41 are also formed in the bearing groove 23 only in a manner adapted to the individual lugs 40.

The lugs 40 are formed integrally with the bearing shaft 25, preferably from a plastics material.

Figure 12:
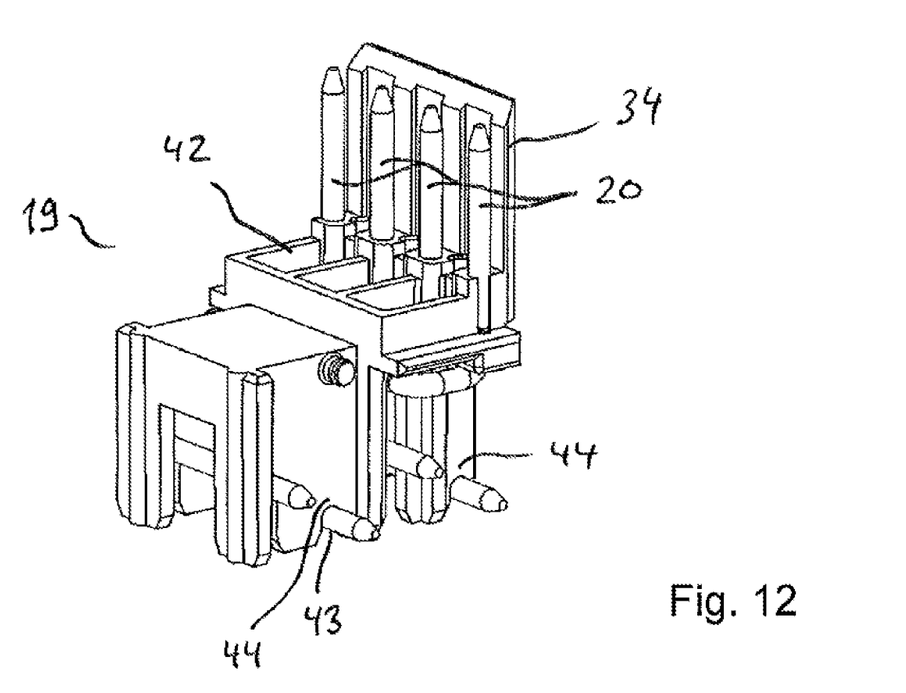
FIG. 12—shows a perspective view of a contact carrier for installation in a fitting location.

FIG. 12 shows a perspective view of a contact carrier 19, which is formed from an insulating material (in particular plastic). The contact carrier 19 has contact pins 20 incorporated fixedly therein, which are arranged for example side by side in a row and extend parallel to one another in the plug-in direction. The contact pins 20 thus each have a linear contact portion, which projects upwardly via the free end thereof from a platform 42 of the contact carrier 19. It is clear that the linear contact portion is surrounded by insulating material of the contact carrier 19 and is secured to the contact carrier 19 in this fixing region. The contact pins 20 are held in a stable manner on the platform in the fixing region by being surrounded by the insulating material to an extent of more than 180° and preferably more than 270° or completely (360°).

It is also clear that the contact pins 20 are bent below the platform 42, such that free ends of the contact pins 20 protrude laterally from the contact carrier 19 for connection to a printed circuit board 82. The direction of extension of these free ends is in this case perpendicular to the direction of extension of the linear contact portions and parallel to the direction of alignment of the contact pins 20 arranged side by side in a row.

It can also be seen that the contact pins 20 with bent portions are guided past one another such that the free ends intended for connection to a printed circuit board 82 are guided past one another without collision and maintaining the necessary clearances and creepage distances and protrude laterally from the contact carrier 19. In this way, a printed circuit board 82 can be attached laterally to the contact carrier 19, said printed circuit board having bores for receiving the free ends and for soldering said free ends to the printed circuit board 82.

The printed circuit board 82 would then extend in a plane that on the one hand is spanned by the direction of the linear contact portions of the contact pins 20 and on the other hand is spanned by a direction perpendicular to the linear contact portion and the free ends for connection to the printed circuit board 82.

It can also be seen that the free ends for connection to the printed circuit board 82 each rest via at least one support region 43 on an associated support base 44. The support bases 44 may be formed for example on a separating web of the contact carrier 19. The support base 44 may be, for example, an indentation, which is shaped in the manner of a part circle and into which the respective contact pin 20 is then inserted from below in the direction of the platform 42. On the side opposite the platform 42, the contact pin is by contrast freely accessible in the support region, such that the contact pins 20 can be inserted from below into the contact carrier 42 during manufacture and can be pressed into the contact carrier 19 or, where appropriate, can be press-fit stemmed.

It can also be seen that a guide wall 34 is formed integrally with the contact carrier 19 on the rear side of the contact carrier 19 adjacent to the platform 42. The guide wall 34 extends parallel to the linear contact portions and spans a plane that is spanned parallel to the linear contact portions of the linear contact pins 20 arranged side by side in a row.

A clearance is provided between the linear contact portions of the contact pins 20 and the guide wall 34, such that a conductor connection plug connector 6 can be plugged onto the contact pins 20 with clamping spring force contact, bearing against the guide wall 34. The guide wall 34 can be formed optimally to receive coding elements, which serve so as to be able to plug in only admissible conductor connection plug connectors 6 in an admissible orientation.

Figure 13:
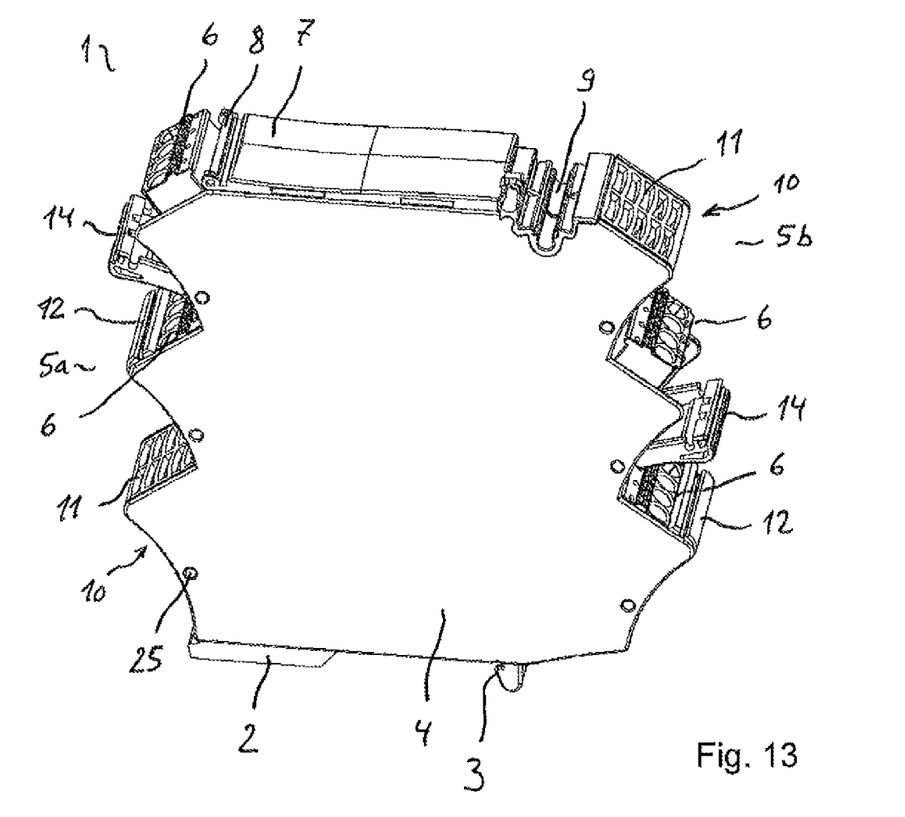
FIG. 13—shows a perspective view of a further exemplary arrangement of the electronics device housing.

FIG. 13 shows a perspective view of an electronics device housing 1 in a slightly different assembly. It can be seen that a blind cap element 11 is now fitted on the right-hand end side 5b at the upper fitting location 10. An ejector element 14 is provided at the fitting location therebelow so as to be able to detachably plug in a conductor connection plug connector 6. A locking element 12 is provided at the lower level in order to receive a conductor connection plug connector 6 in a fixedly locked manner.

By contrast, a blind cap element 11 is located on the left-hand end side at the lower fitting location 10, that is to say at the lowermost level. In addition, a locking element 12 is provided in order to receive a conductor connection plug connector 6 in a fixedly locked manner.

By contract, a pivotable ejector element 14 for detachably receiving a conductor connection plug connector 6 is introduced at the upper fitting location 10.

It is thus clear that the individual fitting locations 10 can be provided, depending on requirements, with ejector elements 14, locking elements 12 or blind cap elements 11, and therefore the fitting locations can be fitted selectively with conductor connection plug connectors 6 or not in the case of blind cap elements 11.

Figure 14:
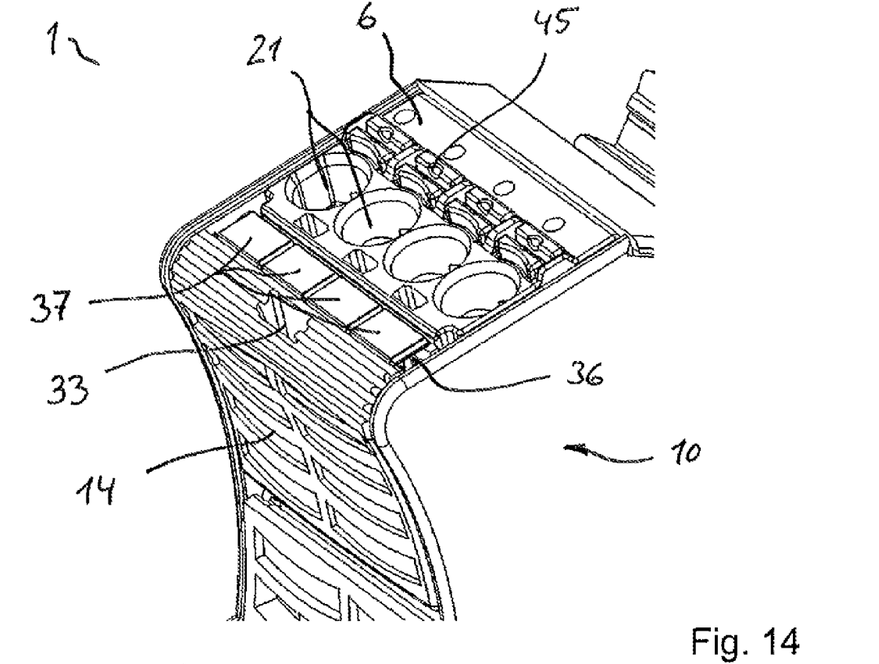
FIG. 14—shows a detail of an electronics device housing in the region of a conductor connection plug connector with ejector element in the plugged position with labelling elements.

FIG. 14 shows a perspective detail of an electronics device housing 1 in the region of a conductor connection plug connector 6, which is received detachably at the fitting location 10 via a pivotable ejector element 14. It is clear that the conductor connection plug connector has four conductor insertion openings 21 arranged side by side and also, for each conductor insertion opening, an actuation trigger 45 for opening a friction spring arranged in the interior and for releasing an electrical conductor.

It can also be seen that each conductor insertion opening is assigned a labelling element 37. The labelling elements 37 are clipped into a latching groove 36 on the upper side of the ejector element 14.

Figure 15:
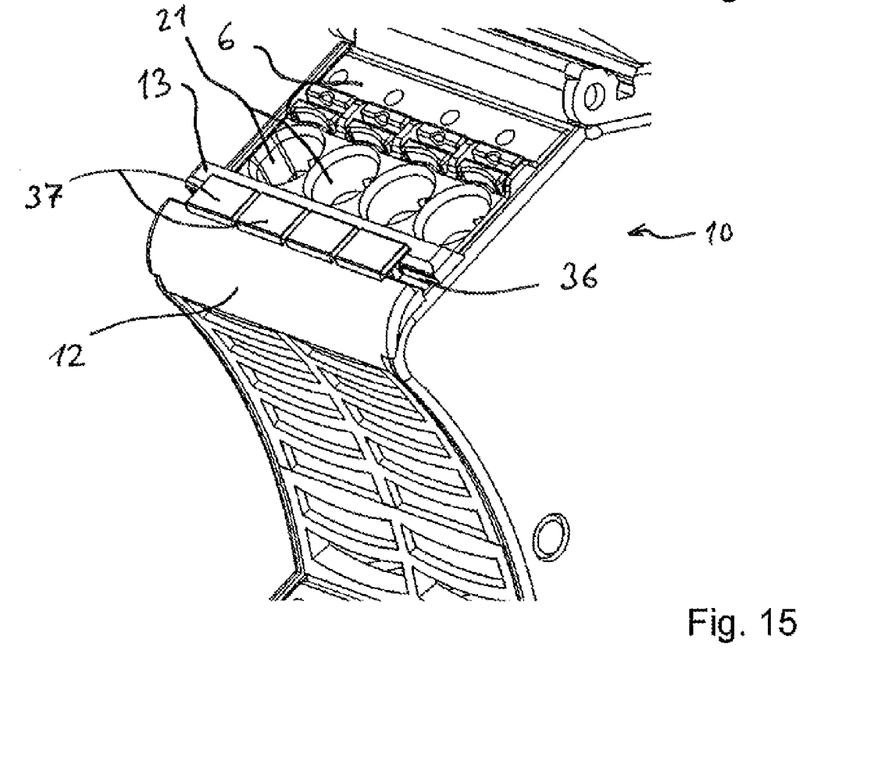
FIG. 15—shows a detail of an electronics device housing in the region of a conductor connection plug connector with locking element in the plugged position with labelling elements.

FIG. 15 shows a corresponding illustration with a locking element 12. It is clear here that a latching groove 36 is formed on the collar 13, which engages over the conductor connection plug connector 16 and secures said connector in the fitting location 10. A labelling element 37 for each conductor insertion opening 21 is again clipped into this latching groove 36.

Figure 16:
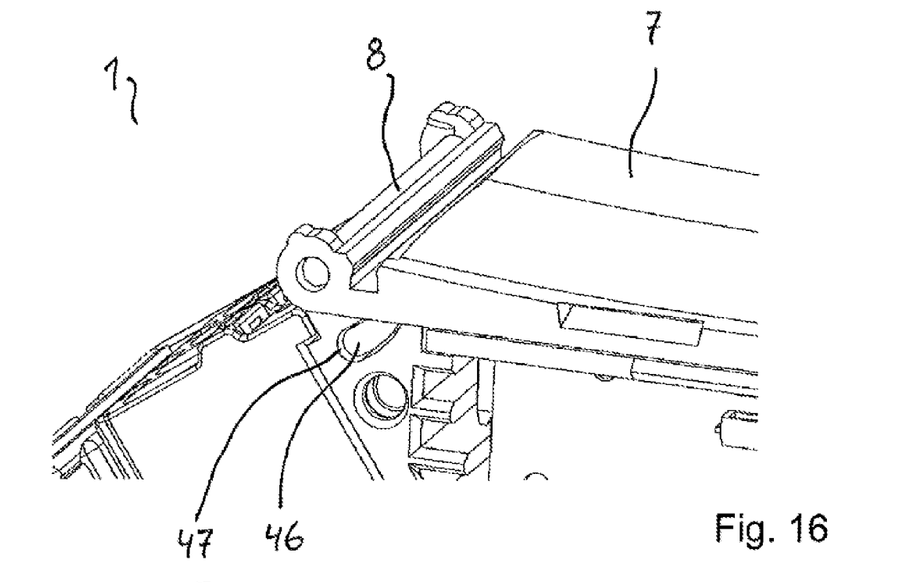
FIG. 16—shows a detail of an electronics device housing with removed side wall in the region of a cover element with locking journal.

FIG. 16 shows a perspective illustration of a detail of the electronics device housing 1 in the region of the cover element 7. It is clear that a curved locking pin 46 is formed integrally on the cover element 7 below the pivot bearing and, in the illustrated closed position, plunges into a locking journal receiving opening 47. With the aid of this locking journal 46, the cover 7 is protected from being inadmissibly levered out upwardly. Then, more specifically, the locking journal 46 forms a stop together with the locking journal receiving opening 47.

Figure 17:
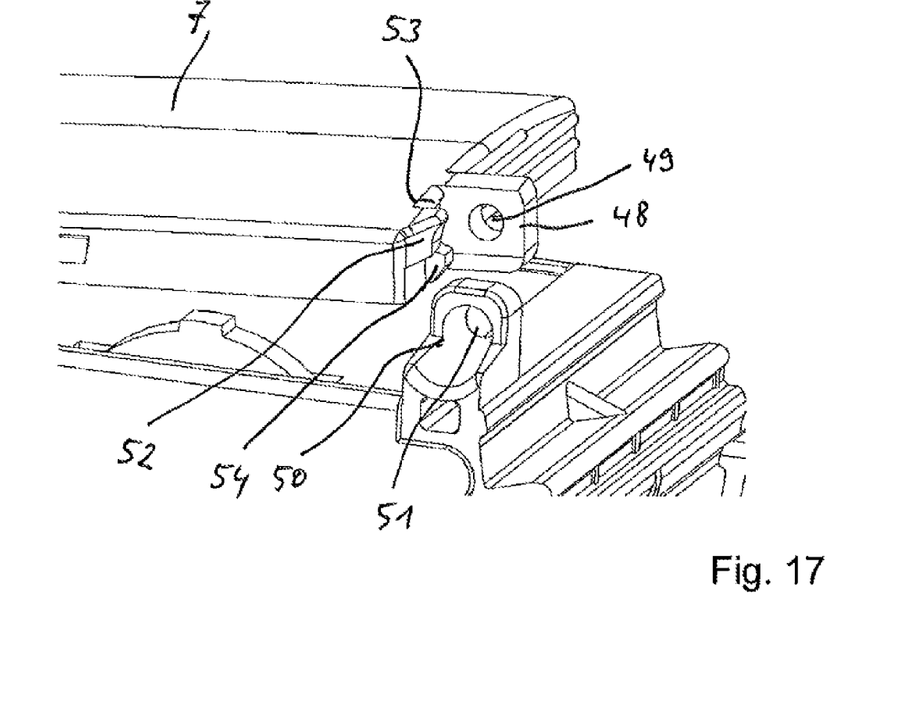
FIG. 17—shows a detail of the electronics device housing according to FIG. 16 in the region of the front end of the cover element.

In order to secure the cover element 7 on the electronics device housing 1 and to seal said cover element with lead, a material tab 48 with an opening 49 is provided at the front, free end of the cover element (see FIG. 17). An eyelet 50, likewise with an opening 51, protrudes from the electronics device housing adjacently to said material tab. When the cover element 7 is in the closed position, the openings 49 and 51 are aligned and a securing tape or securing wire for sealing or, where appropriate, a padlock can be guided through the opening 49, 51. The cover element 7 is therefore also fastened to the electronics device housing 1 in a manipulation-proof manner with the aid of the locking journal 46.

The cover element 7 is also secured against the fact that a guide lug 52 for forming a guide groove 53 may protrude at a distance from the material tab 48. When the cover element 7 is pivoted downwardly, the eyelet 50 plunges partially into the guide groove 53. With the aid of the guide lug 52, the cover element 7 is prevented from being displaced laterally.

A latching lug 54 protrudes below the guide lug 52 and latches with the eyelet 50 and secures the cover element 7 in the closed position on the electronic device housing 1.

The invention claimed is:

1. An electronics device housing, comprising:
   two side wall elements, two end sides and a base plate, said two end sides being spaced apart from one another and connected to the two sidewalls elements and the base plate to define a housing having an intermediate space for receiving at least one printed circuit board;
   at least one fitting location to receive at least one plug connector, the at least one fitting location arranged on at least one of the two end sides in the intermediate space between the side wall elements,
   receiving devices in the region of the at least one fitting location, said receiving devices being designed to selectively receive
      an ejector element having a mount pivotably attachable to the electronics device housing via at least one of the receiving devices, for ejecting the plug connector from the at least one fitting location, or
      a locking element having a latch mechanism, fixedly latchable to the electronics device housing via at least one of the receiving devices, for locking a plug connector at the at least one fitting location.

2. The electronics device housing as claimed in claim 1, wherein the receiving devices are configured to selectively receive a blind cap element that is fixedly latchable to the side wall elements via the receiving devices, for covering a free fitting location of the at least one fitting location not intended to receive a plug connector.

3. The electronics device housing as claimed in claim 1, further comprising intermediate wall portions in a region of the at least one fitting location and extending transversely to the side wall elements on a respective end side, the intermediate wall portions having a free upper edge with a bearing groove for receiving a bearing shaft of an ejector element, locking element or blind cap element.

4. The electronics device housing as claimed in claim 3, further comprising openings for receiving free ends of a bearing shaft, the openings arranged on the side wall elements, in line with the bearing groove.

5. The electronics device housing as claimed in claim 4, wherein mutually opposed pairs of openings for receiving free ends of an associated bearing shaft of an ejector element, locking element or blind cap element are provided in a lower region of the at least one fitting locations on the side wall elements.

6. The electronics device housing as claimed in claim 1, further comprising latching journals that protrude in an upper region of the at least one fitting location from the side wall elements into the intermediate space between the two side wall elements, wherein the latching journals are configured to selectively latch an ejector element, mounted pivotably on the electronics device housing, by plunging of at least one latching journal into a latching opening on the ejector element or to fix a locking element or blind cap element by plunging into a peripherally closed bore in the locking element or blind cap element.

7. The electronics device housing as claimed in claim 1, further comprising openings arranged in an upper region of the at least one fitting location in the side wall elements, the openings for receiving
   latching lugs protruding laterally from an ejector element, or
   locking pins protruding laterally from a locking element or blind cap element or which can be plugged fixedly into the openings in the side wall elements.

8. The electronics device housing as claimed in claim 1, wherein the base plate comprises a mounting rail latching foot for latching the electronics device housing onto a mounting rail.

9. The electronics device housing as claimed in claim 1, further comprising:
   a cover element having a locking journal that protrudes from the cover element; and
   at least one curved locking journal receiving opening for receiving an associated locking journal.

10. The electronics device housing as claimed in claim 1, further comprising contact carriers including contact pins having a first free end and a second free end, wherein the contact pins cooperate with the at least one fitting location, the contact pins oriented with the first free end for contact with the printed circuit board, and with the second free end for mating with a plug connector that is pluggable into the at least one fitting location.

11. The electronics device housing as claimed in claim 1, further comprising at least one ejector element having at least one protruding finger adjacent to a bearing shaft, wherein the ejector element is arranged such that the at least one protruding finger, when pivotably installed on the receiving devices, engages below a plug connector plugged in at an associated at least one fitting location so as to eject said plug connector from the at least one fitting location by pivoting the ejector element.

12. The electronics device housing as claimed in claim 1, further comprising at least one locking element having at least one protruding collar on a free upper edge of the at least one locking element, wherein the collar is adapted such that in a position latched on the at least one fitting location the collar engages over a plug connector plugged into the at least one fitting location and said connector is secured against removal from the at least one fitting location.

* * * * *